United States Patent
Yamamoto

[11] Patent Number: 5,978,663
[45] Date of Patent: Nov. 2, 1999

[54] ANTENNA TUNING CIRCUIT

[75] Inventor: Masaki Yamamoto, Fukushima-ken, Japan

[73] Assignee: Alps Electric Co., Ltd., Tokyo, Japan

[21] Appl. No.: 08/957,999

[22] Filed: Oct. 22, 1997

[30] Foreign Application Priority Data

Oct. 23, 1996 [JP] Japan .................................. 8-298092

[51] Int. Cl.⁶ .................................................. H04B 1/18
[52] U.S. Cl. ................................. 455/193.2; 455/193.3; 455/191.2; 455/180.4; 333/174
[58] Field of Search ........................... 455/169.2, 176.1, 455/180.4, 188.2, 191.2, 193.1, 193.2, 193.3; 333/174, 175, 176, 167; 334/58, 42

[56] References Cited

U.S. PATENT DOCUMENTS

| | | | |
|---|---|---|---|
| 3,866,138 | 2/1975 | Putzer | 455/191.2 |
| 4,048,598 | 9/1977 | Knight | 455/191.2 |
| 4,418,428 | 11/1983 | Evans | 455/191.2 |
| 5,202,656 | 4/1993 | Clark et al. | 333/176 |
| 5,291,159 | 3/1994 | Vale | 333/174 |
| 5,412,310 | 5/1995 | Wolk et al. | 333/174 |
| 5,541,558 | 7/1996 | Weber et al. | 333/175 |

FOREIGN PATENT DOCUMENTS 3-52323  6/1991  Japan .................. H03J 3/28

*Primary Examiner*—Paul Loomis
*Attorney, Agent, or Firm*—Brinks Hofer Gilson & Lione

[57] ABSTRACT

An antenna tuning circuit of a tuner with a band switching device, which can eliminate an image disturbance and a disturbance due to a UHF band frequency at reception of a high band and further eliminate a disturbance at a frequency higher than the image frequency at reception of a low band. At the reception of a high band, a coil 32 is provided to be connected between an input terminal 2 and a first high-band coil 9, and a first trap circuit 34 including a first capacitor 14 and the coil 32 is established between the input terminal 2 and an output terminal 4, and further a second trap circuit 35 including a second capacitor 15 and a second high-band coil 11 is formed therebetween.

4 Claims, 3 Drawing Sheets

ANTENNA TUNING CIRCUIT

BACKGROUND OF THE INVENTION

1. Field of the Invention

The present invention relates to an antenna tuning circuit of a tuner with a band switching device.

2. Description of the Related Art

A prior antenna tuning circuit will be described hereinbelow with reference to FIGS. 4 to 8. FIG. 4 shows a prior antenna tuning circuit of a VHF tuner, FIG. 5 illustrates an equivalent circuit at the reception of a high band, and FIG. 6 illustrates an equivalent circuit at the reception of a low band. Further, FIGS. 7 and 8 are illustrations of transmission characteristics of the antenna tuning circuit at the reception of a high band and at the reception of a low band.

First, in FIG. 4, an input terminal 2 of an antenna tuning circuit 1 is connected through a serial matching coil 3 to a preceding circuit (not shown), for example, an antenna filter (attenuating an intermediate frequency band). This matching coil 3 matches the antenna tuning circuit 1 with the antenna filter or the like being the preceding circuit at the reception of a high band. An output terminal 4 of the antenna tuning circuit 1 is connected through a coupling capacitor 5 to a high-frequency amplifier (not shown). A first low-band coil 6 is connected between the input terminal 2 and the ground, while both end portions of a first high-band coil 9 for reception of a high band are connected through first and second switch diodes 7, 8 to both ends of the first low-band coil 6. That is, the one end of the first high-band coil 6 is grounded by a second switch diode 8 while the other end thereof is connected to the input terminal 2 by the first switch diode 7.

Furthermore, between the input terminal 2 and the other end portion of the first high-band coil 9, in addition to the first switch diode 7, a second low-band coil 10 for reception of a low band is connected in parallel. The other end of the first high-band coil 9 is connected through a second high-band coil 11 to a varactor diode 12 which in turn, is grounded. In addition, another varactor diode 13 is connected to the node between the second high-band coil 11 and the varactor diode 12, and the other end of this varactor diode 13 serves as an output terminal 4 of the antenna tuning circuit 1. Accordingly, the second high-band coil 11 takes a condition put between the other end of the first high-band coil 9 and the output terminal 4. Furthermore, a first capacitor 14 is coupled between the input terminal 2 and the output terminal 4, while a second capacitor 15 is coupled between the other end of the first high-band coil 9 and the output terminal 4.

Incidentally, a capacitor 16 connected in series to the second low-band coil 10, a capacitor 17 put between the first switch diode 7 and the second high-band coil 11 and a capacitor 18 making the first low-band coil 6 grounded are for blocking direct currents. In the antenna tuning circuit 1 thus arranged, in accordance with band switching voltages to be applied to band switching terminals HB, LB, the first and second switch diodes 7, 8 respectively take the conducting or non-conducting condition for the high band reception or low band reception, and a tuning voltage from a tuning voltage terminal TU is applied to the varactor diodes 12, 13, thus being tuned to a give frequency in each band.

FIG. 5 is an illustration of an equivalent circuit of the antenna tuning circuit 1 when the first and second switch diodes 7, 8 in FIG. 4 come into the conducting conditions to allow the high band reception. At the high band reception, the first and second switch diodes 7, 8 assume the conducting conditions, and hence the first low-band coil 6 and the first high-band coil 9 is coupled in parallel to each other, and are shown as a coil 19 connected between the input terminal 2 and the ground in FIG. 5. Further, similarly, the first switch diode 7 gets into the conducting state, and both ends of the second low-band coil 10 are short-circuited, so that the second high-band coil 11 is directly connected to the input terminal 2 as shown in FIG. 5. Moreover, since the first switch diode 7 takes the conducting state, the first and second capacitor 14, 15 in FIG. 4 are coupled in parallel to each other, and are thus shown as one capacitor 20 in FIG. 5. The tuning frequency of the antenna tuning circuit 1 in FIG. 5 mainly depends upon the first high-band coil 19 and second high-band coil 11 coupled in series to each other and the varactor diode 12 connected in parallel to these coils 19, 11.

A capacitor 20 between the input terminal 2 and the output terminal 4 in FIG. 5 is connected in parallel to the second high-band coil 11 and varactor diode 13 connected in series to each other, thereby organizing a parallel resonance circuit whose resonance frequency is set to a substantially intermediate frequency (for example, 650 MHz) of the UHF band, with the result that a signal is attenuated at this frequency. That is, the capacitor 20, the second high-band coil 11 and the varactor diode 13 constitute a trap circuit 21 which attenuates the UHF band at the high band reception, thus preventing the penetration of a UHF band signal at the high band reception. In FIG. 7, a transmission characteristic of the antenna tuning circuit 1 occurring at the high band reception is indicated with a curve A. This curve A arises when the tuning circuit 1 is tuned to 343.25 MHz of a high band, and a reference mark A1 on the curve A represents the tuning frequency of 343.25 MHz and a reference mark A2 denotes the trap frequency of 650 MHz.

On the other hand, at the low band reception, the first and second switch diodes 7, 8 in FIG. 4 come into the non-conducting conditions, and therefore the second low-band coil 10 and the second high-band coil 11 are coupled in series to each other. In this case, the second high-band coil 11 is sufficiently smaller than the second low-band coil 10 and its reactance is ignorable in the case of the low band, and hence the second capacitor 15 in FIG. 4 can be regarded to be coupled in parallel to the varactor diode 13, with the result that the equivalent circuit of FIG. 4 becomes as shown in FIG. 6. In FIG. 6, a variable capacitor 22 is due to the parallel connection of the second capacitor 15 and the varactor diode 13. Further, the first capacitor 14 is connected in parallel to the second low-band coil 10 and variable capacitor 22 connected in series to each other, and its parallel resonance frequency is set to a vicinity of an image frequency to the low band frequency. In FIG. 8, a curve B shows a transmission characteristic taken when the antenna tuning circuit 1 in FIG. 4 is tuned to 126.25 MHz of the low band, wherein reference mark B1 represents the tuning frequency of 126.25 MHz while B2 represents the trap frequency of 240 MHz set to a vicinity of the image frequency (European specification).

At the high band reception, for example, when receiving 343.25 MHz, the image frequency becomes 421.05 MHz, while as obvious from FIG. 7 the transmission level (A3 on the curve A) at this frequency in the above-described prior antenna tuning circuit 1 only attenuates by approximately 17 dB (X1 in FIG. 7) with respect to the tuning frequency A1. For this reason, it is disturbed from the image frequency at the high band reception. One possible solution to this problem is to lower the prior trap frequency (A2 on the curve A in FIG. 7) set to the UHF band. However, in this case, the attenuation of the UHF band does not occur and, hence, the disturbance from the UHF band frequency takes place, which makes difficult the resolution of the problems.

In addition, in the FIG. 6 equivalent circuit at the low band reception, the trap circuit 23 shows capacitative at its both ends, that is, between the input terminal 2 and the output terminal 4 in the tuning circuit, at frequencies higher than the trap frequency, and hence, has a serial resonance frequency with the matching coil 3. This frequency appears in a lower band of the UHF band, i.e., 400 MHz, so that a peak point (B3 on the curve B in FIG. 8) arises as the so-called bounce. As indicated by Y1 in FIG. 8, this peak point B3 only attenuates by 3 dB with respect to the low band tuning frequency B1, so that the low band is disturbed from this frequency.

SUMMARY OF THE INVENTION

Accordingly, it is an object of the present invention to provide an antenna tuning circuit which is capable of eliminating the disturbances due to the image frequency and the UHF band frequency.

Another object of this invention is to eliminate the disturbance due to the bounce.

For eliminating the above-mentioned problems, in accordance with the present invention, an antenna tuning circuit comprises an input terminal and an output terminal, and further is composed of a first low-band coil connected between the input terminal and the ground, a first high-band coil whose one end is grounded at reception of a high band, a second high-band coil put between the output terminal and the other end of the first high-band coil, a first capacitor connected between the input terminal and the output terminal, and a second capacitor connected between the other end of the first high-band coil and the output terminal, wherein at reception of a high band a coil is provided to be connected between the input terminal and the other end of the first high-band coil and a first trap circuit including the first capacitor and the coil is established between the input terminal and the output terminal and further a second trap circuit including the second capacitor and the second high-band coil is made therebetween.

In addition, in the antenna tuning circuit according to this invention, the first trap circuit traps a vicinity of an image frequency to a reception frequency of a high band, while the second trap circuit traps a frequency of a UHF band.

Furthermore, in the antenna tuning circuit according to this invention, the coil is put between the input terminal and the other end of the first high-band coil to be in series to a first switch diode which takes a conducting condition at reception of a high band, and the one end of the first high-band coil is grounded through a second switch diode which assumes a conducting condition at reception of a high band.

Moreover, in the antenna tuning circuit according to this invention, a preceding circuit is connected to the input terminal, and at reception of a high band the coil is used as a matching coil to accomplish an impedance matching with the preceding circuit, and a second low-band coil to be connected at reception of a low band is placed between the input terminal and the other end of the first high-band coil.

BRIEF DESCRIPTION OF THE DRAWINGS

The object and features of the present invention will become more readily apparent from the following detailed description of the preferred embodiments taken in conjunction with the accompanying drawings in which.

DETAILED DESCRIPTION OF THE PREFERRED EMBODIMENT

Figure 1:
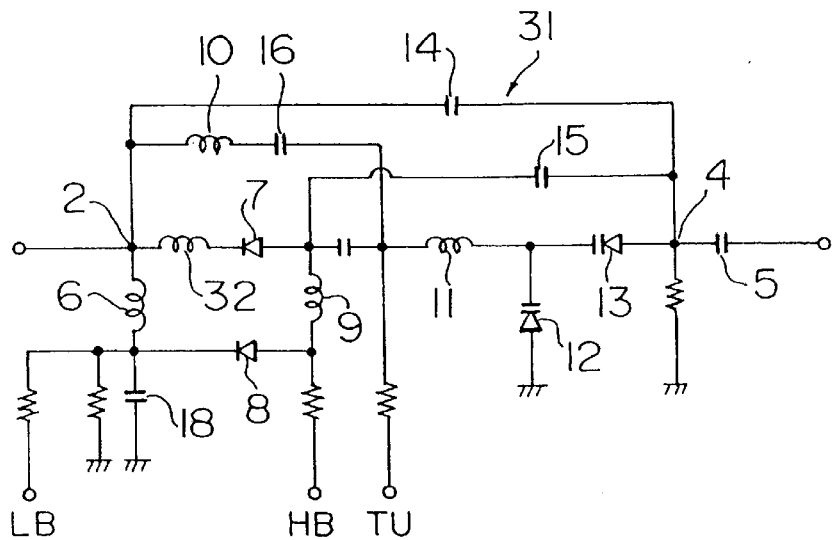
FIG. 1 shows an antenna tuning circuit according to the present invention.
Figure 2:
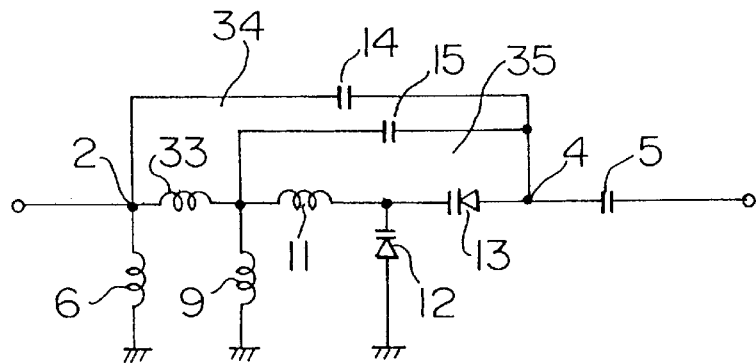
FIG. 2 shows an equivalent circuit of the antenna tuning circuit according to this invention at reception of a high band.
Figure 3:
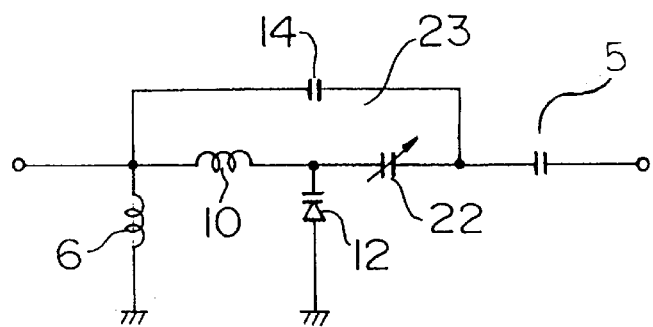
FIG. 3 shows an equivalent circuit of the antenna tuning circuit according to this invention at reception of a low band.

Referring now to FIGS. 1 to 3, a description will be made hereinbelow of an antenna tuning circuit according to an embodiment of the present invention. FIG. 1 shows an antenna tuning circuit according to this invention, FIG. 2 shows an equivalent circuit of the antenna tuning circuit according to this invention at reception of a high band, and FIG. 3 shows an equivalent circuit of the antenna tuning circuit according to this invention at reception of a low band. In these figures, parts which are the same as the prior components are marked with the same numerals, and the description thereof will be omitted for brevity.

Figure 4:
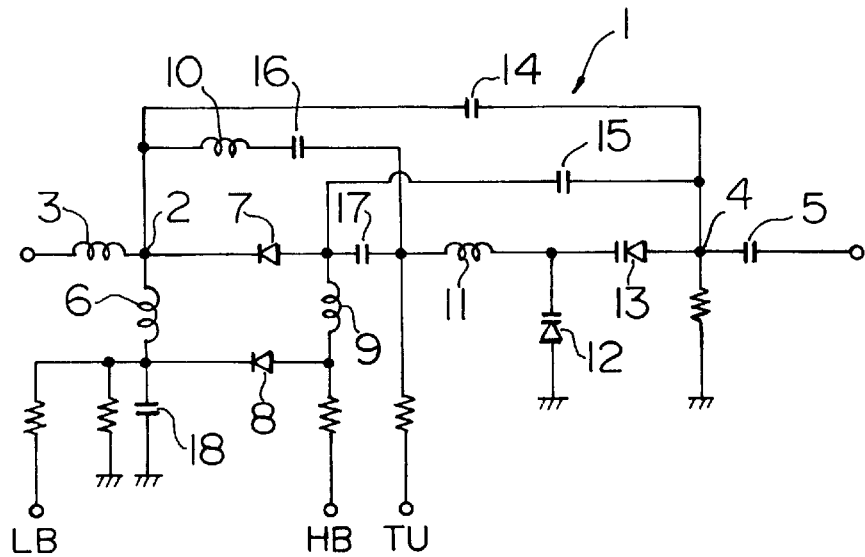
FIG. 4 illustrates a prior antenna tuning circuit.

The difference of an antenna tuning circuit 31 according to the embodiment of this invention from the FIG. 4 prior antenna tuning circuit 1 is that a coil 32 is provided to be connected in series to a first switch diode 7 for connection between an input terminal 2 and a first high-band coil 9. Further, at reception of a high band, this coil 32 is connected between the input terminal and the other end of the first high-band coil 9 when the first switch diode 7 comes into the conducting condition. Still further, this coil 32 has an impedance substantially equal to that of the matching coil 3 of the prior antenna tuning circuit 1. With the provision of this coil 32, the equivalent circuits at the reception of a high band and at reception of a low band are as shown in FIGS. 2 and 3, respectively.

More specifically, at the reception of a high band, when the first and second switch diodes 7, 8 get into the conducting conditions, the second low-band coil 10 in FIG. 1 is connected in parallel to the newly added coil 32. This is shown as an equivalent coil 33 in FIG. 2. Since the inductance of the second low-band coil 10 is larger than that of the coil 32, in the coil 33, the inductance of the coil 32 is under control. Accordingly, a first capacitor 14 is connected between the input terminal 2 and the output terminal 4, and a second capacitor 15 is connected between the other end of the first high-band coil 9 and the output terminal 4. In addition, the coil 33, a second high-band coil 11 and a varactor diode 13 coupled in series to each other are connected in parallel to the first capacitor 14, thus establishing a first trap circuit 34, while the second high-band coil 11 and the varactor diode 13 coupled in series to each other are connected in parallel to the second capacitor 15, thus establishing a second trap circuit 35.

Figure 5:
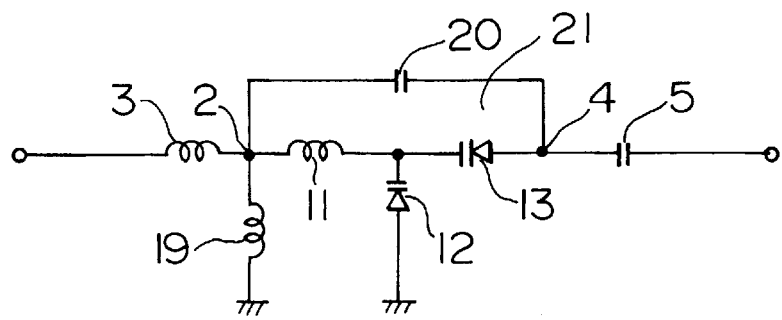
FIG. 5 illustrates an equivalent circuit of the prior antenna tuning circuit at reception of a high band.

The second trap circuit 35 is made such that a trap frequency is set to the UHF band as in the case of the prior trap circuit 21 shown in FIG. 5. The first trap circuit 34 further has the coil 33 as compared with the second trap circuit 35, and therefore, its resonance frequency is set to be lower than that of the second trap circuit 35. In this embodiment, the trap frequency of the first trap circuit 34 is set to a vicinity of an image frequency to the reception frequency, while the trap frequency of the second trap circuit 35 is set to the UHF band. That is, at the reception of 343.25 MHz of a high band, the first trap circuit 34 is set to about 420 MHz, while the second trap circuit 35 is set to 750 MHz (European specification).

Figure 7:
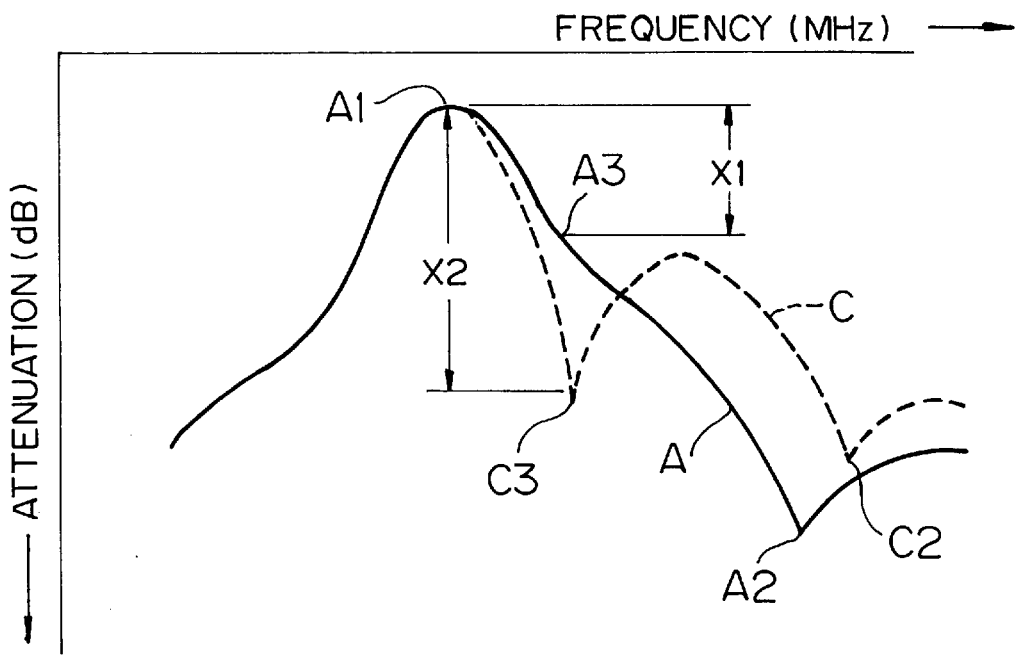
FIG. 7 is an illustration of a transmission characteristic of the antenna tuning circuit at reception of a high band.

In consequence, the transmission characteristic of the tuning circuit 31 becomes as indicated by a curve C in FIG. 7. As obvious from the curve C in FIG. 7, when the image frequency is 421.05 MHz (C1 on the curve C), the attenuation X2 relative to a reception frequency of 343.25 MHz (A1 on the curve A) can reach approximately 30 dB, which shows greater improvement as compared with the prior attenuation X1 (17 dB). Further, in addition to the image frequency, the frequency of the UHF band also attenuates, so that the attenuation of the disturbance signal is possible over a wide band from the image frequency to the UHF band. At the reception of this high band, the first low-band coil 6 is connected between the input terminal 2 and the ground, whereas, in the case of frequencies of a high band, its reactance is large so that there exists no factor for setting the tuning frequency of the tuning circuit 31. Accordingly, as well as the matching coil 3 of the prior tuning circuit 1, the coil 33 has a function to achieve the matching between the antenna tuning circuit 31 and an antenna filter or the like being a preceding circuit.

On the other hand, at reception of a low band, the first and second switch diodes 7, 8 get into the non-conducting conditions, and the first low-band coil 6, the second low-band coil 10 and the second high-band coil 11 are connected in series to each other, and the varactor diode 12 is coupled in parallel to the first low-band coil 6, the second low-band coil 10 and the second high-band coil 11 connected in series to each other. In this case, the second high-band coil 11 is sufficiently smaller than the second low-band coil 10, and at a low band, it reactance is ignorable, and hence the equivalent of the FIG. 1 antenna tuning circuit 31 at the reception of a low band is expressible as shown in FIG. 3.

Figure 6:
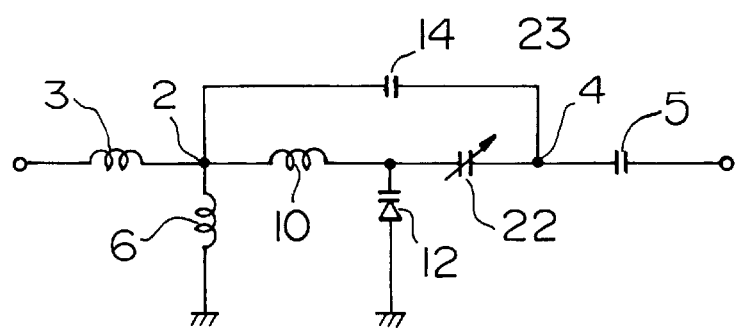
FIG. 6 illustrates an equivalent circuit of the prior antenna tuning circuit at reception of a low band.
Figure 8:
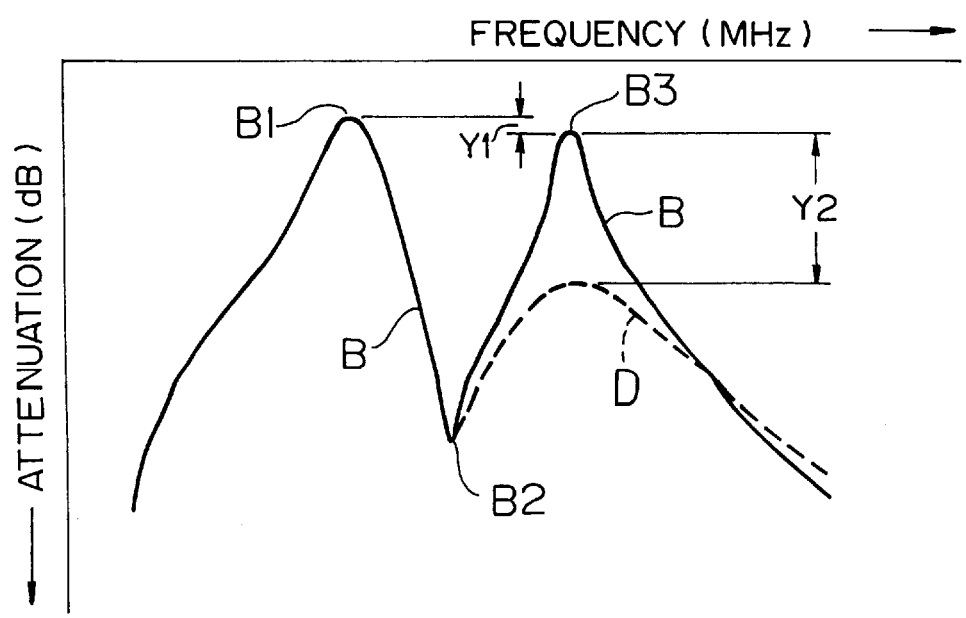
FIG. 8 is an illustration of a transmission characteristic of the antenna tuning circuit at reception of a low band.

The FIG. 3 equivalent circuit is substantially the same as the equivalent circuit of the FIG. 5 prior antenna tuning circuit 1 at the reception of a low band, except that the matching coil 3 shown in FIG. 6 is removed. In addition, the first capacitor 14 is connected in parallel to the second low-band coil 10 and the variable capacitor 22 coupled in series to each other to produce a trap circuit 23 similar to the prior trap circuit. The trap frequency of this trap circuit 23 is set to the image frequency (approximately 240 MHz) as in the case of the prior circuit. In this case, the transmission characteristic becomes as indicated by a curve D in FIG. 8, so that unlike the prior art the bounce B3 due to the matching coil 3 and the trap circuit 23 does not appear, and the attenuation Y2 relative to the reception frequency (B1) at a frequency higher than the image frequency B2 can be insured by approximately 15 dB, which shows greater improvement as compared with the prior attenuation Y1 (3 dB). Accordingly, it is possible to eliminate the disturbance due to the bounce.

As described above, according to this invention, the prior matching coil 3 for the connection between the antenna tuning circuit 1 and an antenna filter or the like being a preceding circuit is removed, while the coil 32 with an inductance substantially equal to that of the matching coil 3 is connected in series to the first switch diode 7 for the connection between the input terminal 2 and the other end of the first high-band coil 9, and therefore, at the reception of a high band, two trap circuits 34, 35 can be established, and at the reception of a low band, the so-called bounce B3 does not arise because of the absence of a coil creating serial resonance with the trap circuit 23. Incidentally, even if the bounce B3 occurs at the reception of a low band, as long as the disturbance due to this bounce does not create a problem, it is possible to place a coil similar to the prior matching coil 3 between the antenna filter or the like being the preceding circuit and the input terminal 2 of the tuning circuit 31. In this case, at least when receiving a high band, it is possible to eliminate both the disturbance due to the image frequency and disturbance due to the frequency of the UHF band.

As described above, since in the antenna tuning circuit according to this invention the coil is provided to be connected between the input terminal and the other end of the first high-band coil at the reception of a high band and the first trap circuit including the first capacitor and this coil is formed between the input terminal and the output terminal and further the second trap circuit including the second capacitor and the second high-band coil is established therebetween, at the reception of a high band these two trap circuits can attenuate the disturbing signal over a wide band.

In addition, in the antenna tuning circuit according to this invention, since the first trap circuit traps a vicinity of an image frequency to the reception frequency of a high band while the second trap circuit traps a frequency of the UHF band, in addition to the frequency of the UHF band it is possible to attenuate the image frequency which particularly tends to cause the disturbance, so that the elimination of the image disturbance becomes possible.

Furthermore, in the antenna tuning circuit according to this invention, since this coil is put in between the input terminal and the other end of the first high-band coil to be in series to the first switch diode which takes the conducting condition at the reception of a high band and the one end of the first high-band coil is grounded through the second switch diode which assumes the conducting condition at the reception of a high band, the two trap circuits can be established in a manner that the first and second switch diodes are merely set to the conducting conditions at the reception of a high band.

Moreover, in the antenna tuning circuit according to this invention, since this coil is used as a matching coil for performing the impedance matching with the preceding circuit at the reception of a high band and the second low-band coil to be connected at the reception of a low band is provided between the input terminal and the other end of the first high-band coil, the so-called bounce does not occur at a frequency higher than the image frequency to the low band frequency, and hence no disturbance due to the bounce occurs.

It should be understood that the foregoing relates to only a preferred embodiment of the present invention, and that it is intended to cover all changes and modifications of the embodiment of the invention herein used for the purpose of the disclosure, which do not constitute departures from the spirit and scope of the invention.

What is claimed is:

1. An antenna tuning circuit with an input terminal and an output terminal, comprising:

a first low-band coil connected between said input terminal and a ground;

a first high-band coil whose one end is grounded at reception of a high band;

a second high-band coil put between said output terminal and the other end of said first high-band coil;

a first capacitor connected between said input terminal and said output terminal; and a second capacitor connected between said other end of said first high-band coil and said output terminal, wherein a coil is provided to be connected between said input terminal and said other end of said first high-band coil at reception of a high band, and a first trap circuit including said first capacitor and said coil is established between said input terminal and said output terminal and further a second trap circuit including said second capacitor and said second high-band coil is made therebetween.

2. An antenna tuning circuit as defined in claim 1, wherein said first trap circuit traps a vicinity of an image frequency to a reception frequency of a high band, while said second trap circuit traps a frequency of a UHF band.

3. An antenna tuning circuit as defined in claim 1, wherein said coil is put between said input terminal and said other end of said first high-band coil to be in series to a first switch diode which takes a conducting condition at the reception of the high band, and the one end of said first high-band coil is grounded through a second switch diode which assumes a conducting condition at the reception of the high band.

4. An antenna tuning circuit as defined in claim 3, wherein a preceding circuit is connected to said input terminal, and at the reception of the high band, said coil is used as a matching coil to accomplish an impedance matching with said preceding circuit, and a second low-band coil to be connected at reception of a low band is placed between said input terminal and said other end of said first high-band coil.

* * * * *